(12) United States Patent
Kang et al.

(10) Patent No.: US 12,208,425 B2
(45) Date of Patent: Jan. 28, 2025

(54) APPARATUS FOR TREATING SUBSTRATE AND METHOD FOR TREATING A SUBSTRATE PRELIMINARY CLASS

(71) Applicant: SEMES CO., LTD., Cheonan-si (KR)

(72) Inventors: Ki-Moon Kang, Yongin-si (KR); Seung Un Oh, Cheonan-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 37 days.

(21) Appl. No.: 18/068,940

(22) Filed: Dec. 20, 2022

(65) Prior Publication Data

US 2023/0211390 A1 Jul. 6, 2023

(30) Foreign Application Priority Data

Dec. 30, 2021 (KR) .................. 10-2021-0192306
Apr. 25, 2022 (KR) .................. 10-2022-0050609

(51) Int. Cl.
*B08B 7/04* (2006.01)
*B08B 7/00* (2006.01)
*B08B 13/00* (2006.01)

(52) U.S. Cl.
CPC ............ *B08B 13/00* (2013.01); *B08B 7/0021* (2013.01)

(58) Field of Classification Search
None
See application file for complete search history.

(56) References Cited

FOREIGN PATENT DOCUMENTS

| CN | 108155116 A | 6/2018 |
|---|---|---|
| KR | 10-1139078 B1 | 4/2012 |
| KR | 10-2014-0030218 A | 3/2014 |
| KR | 10-2017-0137245 A | 12/2017 |
| KR | 102158232 B1 | 9/2020 |
| TW | 201618864 A | 6/2016 |
| TW | 202117898 A | 5/2021 |

OTHER PUBLICATIONS

Google Patents translation of KR101139078B1 (Year: 2024).*
Google Patents translation of KR20170137245 (Year: 2024).*
Office Action for Taiwanese Application No. 11220437370 dated May 4, 2023, 14 pages.
Office Action dated Jan. 9, 2024 issued in corresponding Japanese Patent Application No. 10-2022-0050609, 6 pages, not in English.

* cited by examiner

*Primary Examiner* — Eric W Golightly
(74) *Attorney, Agent, or Firm* — Harness, Dickey & Pierce, P.L.C.

(57) ABSTRACT

The inventive concept provides a substrate treating method. The substrate treating method includes first treating a substrate in a treating space according to a reference recipe; second treating a substrate in the treating space according to the reference recipe after the first treating; and optimizing an inner ambient of the treating space according to the reference recipe, and wherein the optimizing includes a purge operation of supplying and discharging a treating fluid to/from the treating space.

9 Claims, 10 Drawing Sheets

APPARATUS FOR TREATING SUBSTRATE AND METHOD FOR TREATING A SUBSTRATE PRELIMINARY CLASS

CROSS-REFERENCE TO RELATED APPLICATIONS

This application claims priority under 35 U.S.C. § 119 to Korean Patent Application No. 10-2021-0192306 filed on Dec. 30, 2021 and Korean Patent Application No. 10-2022-0050609 filed on Apr. 25, 2022, in the Korean Intellectual Property Office, the disclosures of which are incorporated by reference herein in their entireties.

BACKGROUND

Embodiments of the inventive concept described herein relate to a substrate treating apparatus and method, more specifically, a substrate treating apparatus and a substrate treating method for dry-treating a substrate.

In general, various processes such as a photolithography process, an etching process, an ion implantation process, and a deposition process are performed to manufacture a semiconductor element. In addition, various foreign substances such as particles, organic contaminants, and metal byproducts are generated while performing such processes. These foreign substances cause defects in the substrate and act as a factor which directly affects a performance and a yield of the semiconductor element. A cleaning process for removing such foreign substances is essentially accompanied in a manufacturing process of the semiconductor element.

Recently, a supercritical fluid is used in a substrate cleaning process or a substrate developing process. According to an embodiment, after wetting a treating liquid on a top surface of a substrate, a fluid such as a carbon dioxide is changed to a supercritical state and supplied to the top surface of the substrate to remove a remaining treating liquid on the substrate. If the supercritical fluid deviates from a pressure and a temperature appropriate for the process during a treatment of the substrate using the supercritical fluid, the supercritical fluid cannot remain in the supercritical state. A space through which the supercritical fluid flows should maintain a process pressure and a process temperature. For example, an inside of a treating space at which the substrate is treated and a pipe through which the supercritical fluid is supplied must maintain the process pressure and the process temperature.

After treating a preceding substrate using the supercritical fluid, a subsequent substrate may be treated using the supercritical fluid after standing by for a predetermined time. During the standby, the temperature and the pressure inside the treating space varies. It takes a lot of time to change an inner pressure and the temperature of a changed treating space to the process pressure and the process temperature. In addition, the inner pressure and the temperature of the pipe to which the supercritical fluid is supplied during the standby time also varies. If the pressure and the temperature of a supply pipe change, the supercritical fluid is liquefied and fixed due to a phase change within a supply pipe. Accordingly, it is difficult to smoothly supply the supercritical fluid through the supply pipe, and as the supercritical fluid is fixed within inside the pipe, byproducts are formed within the pipe. The byproducts formed within the pipe flow together into the treating space when the supercritical fluid is supplied to the treating space, increasing a degree of contamination within the treating space. The byproducts flowing into the treating space are attached to the substrate again when a subsequent substrate is treated, causing process defects of the substrate. In addition, if the supercritical fluid is fixed within inside the pipe, the pressure inside the pipe increases and ultimately causes damage to the pipe.

SUMMARY

Embodiments of the inventive concept provide a substrate treating apparatus and method for efficiently treating a substrate.

Embodiments of the inventive concept provide a substrate treating apparatus and method for minimizing byproducts from being generated within the apparatus while treating a substrate using a supercritical fluid.

Embodiments of the inventive concept provide a substrate treating apparatus and method for efficiently removing byproducts generated within the apparatus while treating a substrate using a supercritical fluid.

The technical objectives of the inventive concept are not limited to the above-mentioned ones, and the other unmentioned technical objects will become apparent to those skilled in the art from the following description.

The inventive concept provides a substrate treating method. The substrate treating method includes first treating a substrate in a treating space according to a reference recipe; second treating a substrate in the treating space according to the reference recipe after the first treating; and optimizing an inner ambient of the treating space according to the reference recipe, and wherein the optimizing includes a purge operation of supplying and discharging a treating fluid to/from the treating space.

In an embodiment, an idle period is provided between the first treating and the second treating, and the optimizing is performed during the idle period.

In an embodiment, the purge operation is performed if any one of a temperature of the treating space and a temperature of a pipe supplying the treating fluid deviates from a reference range during the idle period.

In an embodiment, the purge operation is performed until the temperature of the treating space and the temperature of the pipe each satisfy the reference range.

In an embodiment, the optimizing is performed before a substrate previously stored at a cassette is taken into the treating space according to the reference recipe.

In an embodiment, the optimizing is performed after the substrate previously stored at a cassette is treated in the treating space during the first treating.

In an embodiment, the treating fluid is supplied to each of an upper portion and a lower portion of the treating space.

In an embodiment, the treating fluid is a supercritical fluid.

In an embodiment, the inner ambient includes a temperature, a pressure, and/or a contamination rate.

In an embodiment, the first treating and the second treating comprise removing a liquid on the substrate by supplying a supercritical fluid to the treating space.

The inventive concept provides a substrate treating method. The substrate treating method includes first treating a first substrate using a supercritical fluid in a process chamber having a treating space; after the first treating, providing an idle period; after the idle period, second treating a second substrate using the supercritical fluid in the process chamber; and, performing a purge operation including supplying and discharging a treating fluid to/from the treating space during the idle period in order to optimize an inner ambient of the treating space.

In an embodiment, the purge operation is performed if any one of a temperature of the treating space and a temperature of a pipe supplying the treating fluid deviates from a reference range during the idle period.

In an embodiment, the purge operation is performed until the temperature of the treating space and the temperature of the pipe satisfy the reference range.

In an embodiment, the treating fluid includes a supercritical fluid, is supplied to each of an upper portion and a lower portion of the treating space, and is discharged from the treating space at a bottom.

In an embodiment, the inner ambient includes a temperature, a pressure, and/or a contamination rate.

In an embodiment, the purge operation is performed before a substrate previously stored at a cassette is taken into the treating space during a process performed before the idle period.

In an embodiment, the purge operation is performed after a substrate previously stored at a cassette is treated at the treating space during a process performed before the idle period.

The inventive concept provides a substrate treating apparatus. The substrate treating apparatus includes a housing having a treating space for treating a substrate; a support unit configured to support the substrate in the treating space; a fluid supply unit including a supply pipe supplying a treating fluid to the treating space; a fluid discharge unit configured to discharge the treating fluid from the treating space; a heating unit configured to adjust a temperature of the treating space and a temperature of the supply pipe; and a controller, and wherein the controller controls the apparatus to perform a first treating in the treating space according to a reference recipe, a second treating in the treating space according to the reference recipe after the first treating, provide an idle period between the first treating and the second treating, and perform a purge operation comprising supplying and discharging the treating fluid to the treating space according to the reference recipe during the idle period so as to optimize an inner ambient of the treating space.

In an embodiment, the controller controls the apparatus to perform the purge operation if any one of a temperature of the treating space and a temperature of a pipe supplying the treating fluid deviates from a reference range during the idle period, and the purge operation is performed until the temperature of the treating space and the temperature of the pipe each satisfy the reference range by controlling the heating unit.

In an embodiment, the process fluid and the treating fluid is a supercritical fluid.

According to an embodiment of the inventive concept, a substrate may be efficiently treated.

According to an embodiment of the inventive concept, byproducts generated within a treating space and a pipe having a supercritical fluid flowing therein may be minimized while a substrate is treated using the supercritical fluid.

According to an embodiment of the inventive concept, byproducts generated within a treating space and a pipe having a supercritical fluid flowing therein may be efficiently removed while a substrate is treated using the supercritical fluid.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
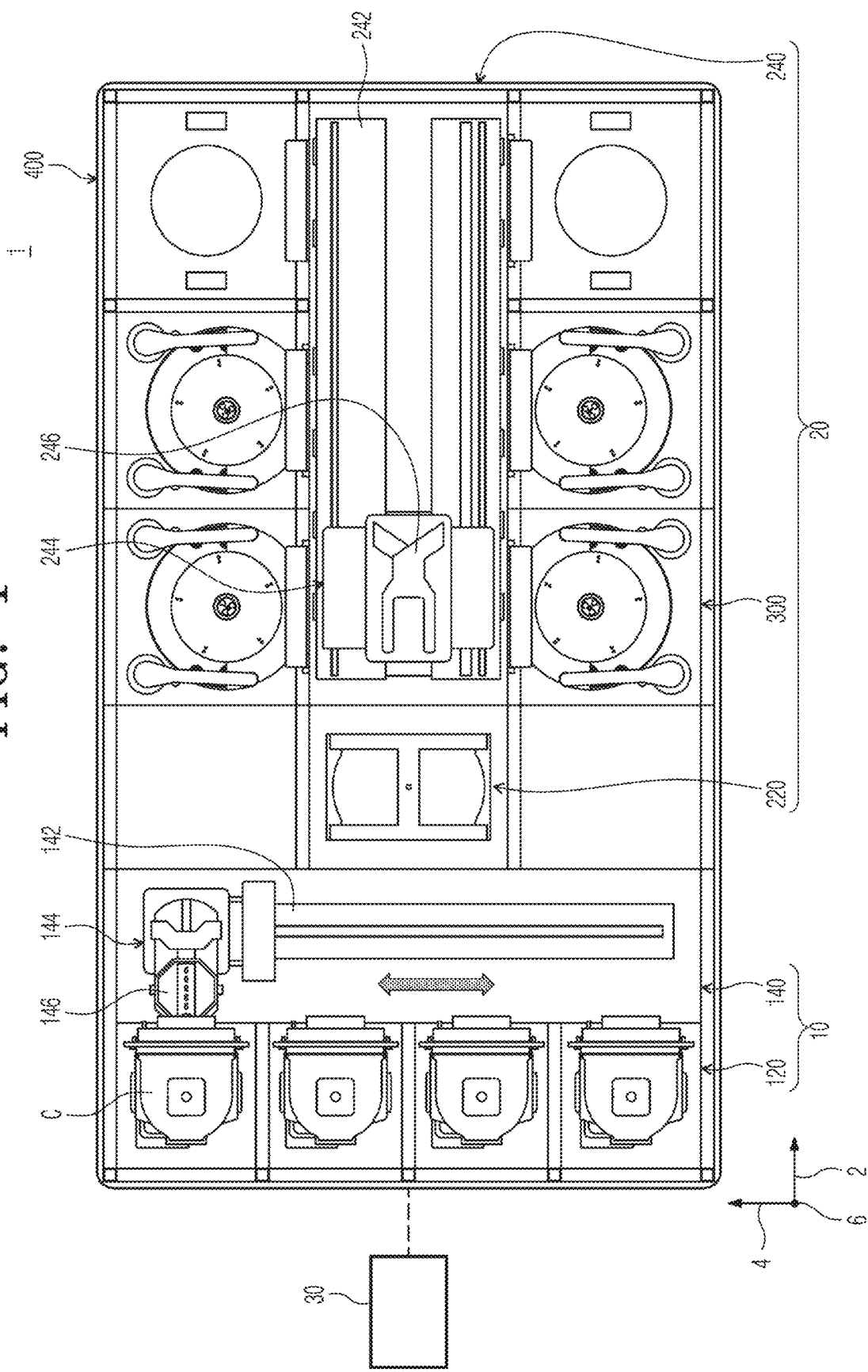
FIG. 1 schematically illustrates an embodiment of a substrate treating apparatus according to the inventive concept.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Hereinafter, embodiments of the inventive concept will be described in detail with reference to the accompanying drawings.

In the inventive concept, a liquid treating process of treating a substrate by supplying a liquid such as a cleaning liquid to the substrate will be described as an example. However, the inventive concept described below is not limited to a cleaning process, and may be applied to various processes of treating the substrate W using a liquid, such as an etching process, an ashing process, or a developing process.

Hereinafter, an embodiment of a substrate treating apparatus 1 of the inventive concept will be described in detail with reference to FIG. 1 to FIG. 11. The substrate treating apparatus 1 according to an embodiment of the inventive concept may perform a cleaning process including a drying process of drying a substrate W using a process fluid. For example, the substrate treating apparatus 1 according to an embodiment of the inventive concept may perform the drying process of drying the substrate W using a supercritical fluid.

FIG. 1 is a plan view schematically illustrating an embodiment of the substrate treating apparatus of the inventive concept. Referring to FIG. 1, the substrate treating apparatus 1 includes an index module 10 and a treating module 20. According to an embodiment, the index module 10 and the treating module 20 are disposed in a direction. Hereinafter, a direction in which the index module 10 and the treating module 20 are disposed is defined as a first direction 2. When viewed from above, a direction perpendicular to the first direction 2 is referred to as a second direction 4, and a direction perpendicular to a plane including both the first direction 2 and the second direction 4 is defined as a third direction 6.

The index module 10 transfers the substrate W to the treating module 20 which treats the substrate W from a cassette C at which the substrate W is stored. The index module 10 stores a substrate W on which a treatment has been completed at the treating module 20 in the cassette C. A lengthwise direction of the index module 10 is provided in the second direction 4. The index module 10 has a load port 120 and an index frame 140.

The cassette C in which the substrate W is stored is mounted on the load port 120. The load port 120 is positioned on an opposite side of the treating module 20 based on the index frame 140. A plurality of load ports 120 may be provided. The plurality of load ports 120 may be arranged in a line along the second direction 4. The number of load ports 120 may increase or decrease according to a process efficiency and foot print conditions of the treating module 20.

A plurality of slots (not shown) are formed in the cassette C. The substrates W may be mounted on the slot (not shown). The plurality of slots (not shown) may be disposed to be spaced apart from each other in the third direction 6. Each of the substrates W may be mounted on a slot (not shown) and stored in the cassette C in a state in which the substrates W are disposed horizontally with respect to the ground.

The cassette C may be a sealed container such as a front opening unified pod (FOUP). The cassette C may be placed on the load port 120 by a transfer means (not shown) such as an overhead transfer, an overhead conveyor, or an automatic guided vehicle or by an operator.

An index rail 142 and an index robot 144 are provided inside the index frame 140. A lengthwise direction of the index rail 142 is provided along the second direction 4 in the index frame 140. The index robot 144 may transfer the substrate W. The index robot 144 may transfer the substrate W between the index module 10 and a buffer unit 220 to be described later.

The index robot 144 includes an index hand 146. The substrate W is mounted on the index hand 146. The index hand 146 may be provided to be movable along the second direction 4 on the index rail 142. Accordingly, the index hand 146 may forwardly and backwardly move along the index rail 142. In addition, the index hand 146 may be provided to be rotatable with the third direction 6 as an axis. In addition, the index hand 146 may be provided to be vertically movable along the third direction 6. A plurality of index hands 146 may be provided. The plurality of index hands 146 may be provided to be spaced apart in the vertical direction. The plurality of index hands 146 may forwardly and backwardly move, and rotate independently of each other.

The controller 30 may control the substrate treating apparatus 1. The controller 30 may comprise a process controller consisting of a microprocessor (computer) that executes a control of the substrate treating apparatus 1, a user interface such as a keyboard via which an operator inputs commands to manage the substrate treating apparatus 1, and a display showing the operation situation of the substrate treating apparatus 1, and a memory unit storing a treating recipe, i.e., a control program to execute treating processes of the substrate treating apparatus 1 by controlling the process controller or a program to execute components of the substrate treating apparatus 1 according to data and treating conditions. In addition, the user interface and the memory unit may be connected to the process controller. The treating recipe may be stored in a storage medium of the storage unit, and the storage medium may be a hard disk, a portable disk, such as a CD-ROM or a DVD, or a semiconductor memory, such as a flash memory.

The controller 30 may control the substrate treating apparatus 1 to perform the substrate treating method described below. For example, the controller 30 may perform a substrate treating method described below by controlling components provided to the drying chamber 400 to be described later.

The treating module 20 includes a buffer unit 220, a transfer frame 240, a liquid treating chamber 300, and a drying chamber 400. The buffer unit 220 provides a buffer space in which a substrate W taken into the treating module 20 and a substrate W taken out from the treating module 20 temporarily remain. The transfer frame 240 provides a transfer space for transferring the substrate W between the buffer unit 220, the liquid treating chamber 300, and the drying chamber 400.

The liquid treating chamber 300 may perform a liquid treatment process of liquid-treating the substrate W by supplying a liquid to the substrate W. The drying chamber 400 may perform a drying treatment to remove a liquid remaining on the substrate W. The liquid treating chamber 300 and the drying chamber 400 may perform a cleaning process. The cleaning process may be sequentially performed in the liquid treating chamber 300 and the drying chamber 400. For example, in the liquid treating chamber 300, the substrate W may be treated by supplying a chemical, a rinsing liquid, and/or an organic solvent to the substrate W. For example, in the drying chamber 400, a drying treatment may be performed to remove a liquid remaining on the substrate W using the supercritical fluid.

The buffer unit 220 may be disposed between the index frame 140 and the transfer frame 240. The buffer unit 220 may be positioned at an end of the transfer frame 240. A slot (not shown) on which the substrate W is placed is provided within the buffer unit 220. A plurality of slots (not shown) are provided. The plurality of slots (not shown) may be disposed to be spaced apart from each other along the third direction 6. In the buffer unit 220, a front face and a rear face are opened. The front face may be a surface facing the index frame 140, and the rear face may be a surface facing the transfer frame 240. The index robot 144 may access the buffer unit 220 through the front face, and the transfer robot 244 to be described later may access the buffer unit 220 through the rear face.

A lengthwise direction of the transfer frame 240 may be provided along the first direction 2. The liquid treating chamber 300 and the drying chamber 400 may be disposed on both sides of the transfer frame 240. The liquid treating chamber 300 and the drying chamber 400 may be disposed on a side of the transfer frame 240. The transfer frame 240 and the liquid treating chamber 300 may be disposed along the second direction 4. In addition, the transfer frame 240 and the drying chamber 400 may be disposed along the second direction 4.

According to an embodiment, the liquid treating chambers 300 are disposed on both sides of the transfer frame 240, and the drying chambers 400 are disposed on both sides of the transfer frame 240. The liquid treating chambers 300 may be disposed at positions relatively closer to the buffer unit 220 than the drying chambers 400. The liquid treating chambers 300 may be each provided in an array of A×B (A, B are natural numbers greater than 1 or 1 respectively) along the first direction 2 and the third direction 6 on a side of the transfer frame 240. Here, A is the number of liquid treating chambers 300 provided in a row along the first direction 2, and B is the number of liquid treating chambers 300 provided in a row along the third direction 6. For example, if four liquid treating chambers 300 are provided on a side of the transfer frame 240, the liquid treating chambers 300 may be arranged in an array of 2×2. The number of the liquid treating chambers 300 may increase or decrease. Unlike the aforementioned description, the liquid treating chamber 300 may be provided only on a side of the transfer frame 240, and only the drying chambers 400 may be disposed on the other side opposite to the side. In addition, the liquid treating chamber 300 and the drying chamber 400 may be provided in a single layer on a side and both sides of the transfer frame 240.

The transfer frame 240 has a guide rail 242 and a transfer robot 244. The guide rail 242 and the transfer robot 244 are provided within the transfer frame 240. A lengthwise direction of the guide rail 242 may be provided in the first direction 2. The transfer robot 244 may be provided to be linearly movable along the first direction 2 on the guide rail 242. The transfer robot 244 transfers the substrate W between the buffer unit 220, the liquid treating chamber 300, and the drying chamber 400.

The transfer robot 244 includes a transfer hand 246 on which the substrate W is placed. The transfer hand 246 may be provided to be movable along the first direction 2 on the guide rail 242. Accordingly, the transfer hand 246 may be forwardly and backwardly movable along the guide rail 242. In addition, the transfer hand 246 may be provided to rotate around the third direction 6 and to be movable along the third direction 6. A plurality of transfer hands 246 may be provided. The plurality of transfer hands 246 may be provided to be spaced apart in the vertical direction. The plurality of transfer hands 246 may be forwardly and backwardly movable, and may rotate independently of each other.

The liquid treating chamber 300 performs a liquid treatment process on the substrate W. For example, the liquid treating chamber 300 may be a chamber which performs a cleaning process of removing process by-products attached to the substrate W or byproducts such as particles. The liquid treating chamber 300 may have a different structure depending on a process type of treating the substrate W. Selectively, each of the liquid treating chambers 300 may have the same structure.

Figure 2:
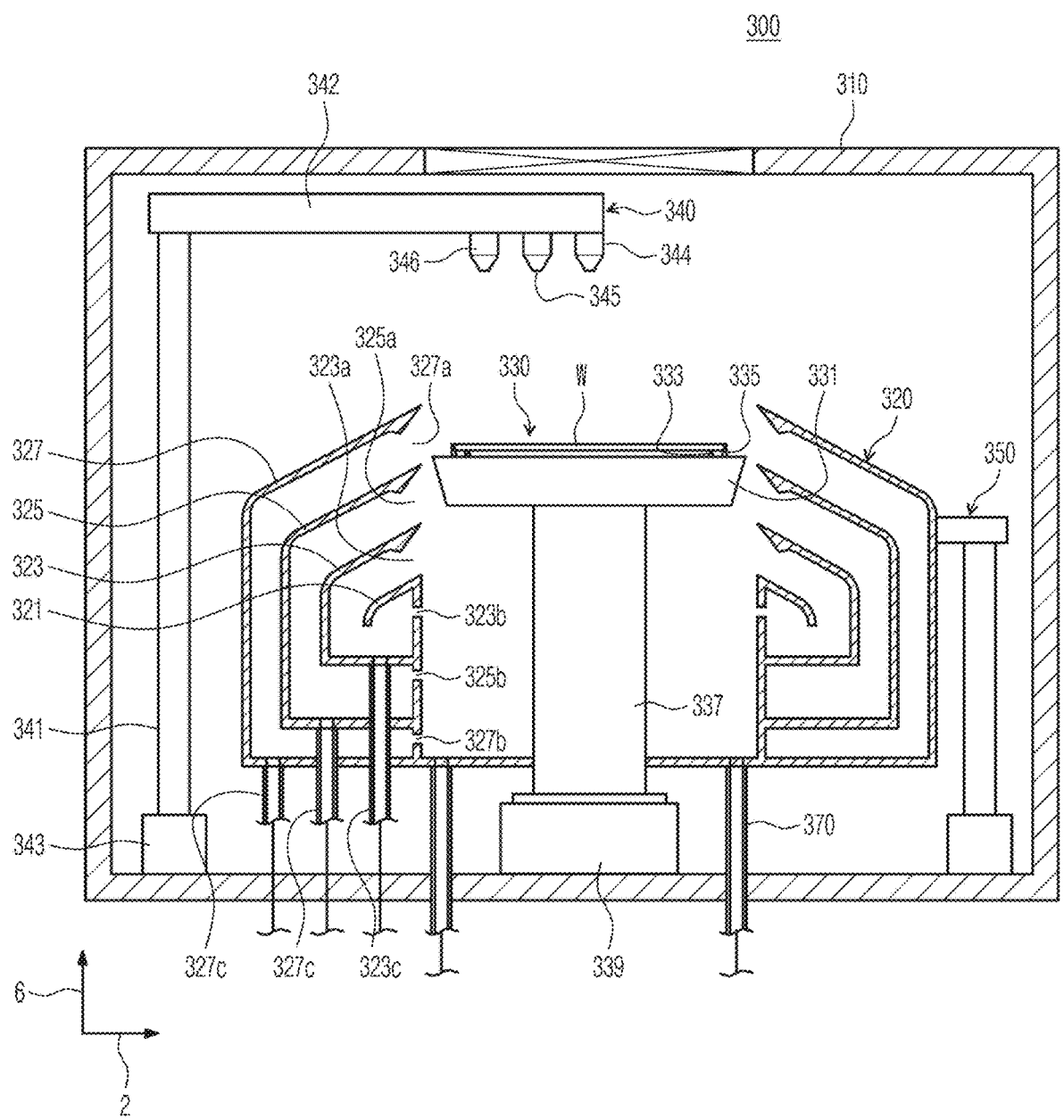
FIG. 2 schematically illustrates an embodiment of a liquid treating chamber of FIG. 1.

FIG. 2 schematically illustrates an embodiment of the liquid treating chamber of FIG. 1. Referring to FIG. 2, the liquid treating chamber 300 includes a chamber 310, a treating container 320, a support member 330, and a liquid supply unit 340.

The chamber 310 has an inner space. The chamber 310 is generally provided in a rectangular parallelepiped shape. An opening (not shown) is formed on a side of the chamber 310. The opening (not shown) functions as an entrance through which the substrate W is taken into or taken out of the inner space of the chamber 310 by the transfer robot 244. The treating container 320, the support member 330, and the liquid supply unit 340 are disposed in the inner space of the chamber 310.

The treating container 320 has a treating space with an open top portion. The treating container 320 may be a bowl having a treating space. The treating container 320 may be provided to surround the treating space. The treating space of the treating container 320 is provided as a space in which the support member 330, which will be described later, supports and rotates the substrate W. In addition, the treating space is provided as a space in which the liquid supply unit 340 to be described later supplies a liquid to the substrate W to treat the substrate W.

According to an embodiment, the treating container 320 may have a guide wall 321 and a plurality of recollecting containers 323, 325, and 327. Each of the recollecting containers 323, 325, and 327 separates and recollects different liquids from the liquids used in a treatment of the substrate W. Each of the recollecting containers 323, 325, and 327 may have a recollecting space for recollecting a liquid used for treating the substrate W.

The guide wall 321 and the recollecting containers 323, 325, and 327 are provided in an annular ring shape surrounding the support member 330. If the liquid is supplied to the substrate W, the liquid scattered by a rotation of the substrate W may be introduced into the recollecting space through inlets 323a, 325a, and 327a of each of the recollecting containers 323, 325, and 327a to be described later. Different types of liquids may be introduced into each of the recollecting containers 323, 325, and 327.

The treating container 320 has a guide wall 321, a first recollecting container 323, a second recollecting container 325, and a third recollecting container 327. The guide wall 321 is provided in an annular ring shape surrounding the support member 330. The first recollecting container 323 is provided in an annular ring shape surrounding the guide wall 321. The second recollecting container 325 is provided in an annular ring shape surrounding the first recollecting container 323. The third recollecting container 327 is provided in an annular ring shape surrounding the second recollecting container 325.

A space between the guide wall 321 and the first recollecting container 323 functions as a first inlet 323a through which a liquid is introduced. A space between the first recollecting container 323 and the second recollecting container 325 functions as a second inlet 325a through which liquid is introduced. A space between the second recollecting container 325 and the third recollecting container 327 functions as a third inlet 327a through which a liquid is introduced. The second inlet 325a may be positioned above the first inlet 323a, and the third inlet 327a may be positioned above the second inlet 325a. The liquids introduced into the first inlet 323a, the second inlet 325a, and the third inlet 327a can be different types of liquids.

The space between a bottom end of the guide wall 321 and the first recollecting container 323 functions as a first outlet 323b through which byproducts generated from the liquid and air flows are discharged. A space between a bottom end of the first recollecting container 323 and the second recollecting container 325 functions as a second outlet 325b through which byproducts generated from the liquid and air flows are discharged. A space between a bottom end of the second recollecting container 325 and the third recollecting container 327 functions as a third outlet 327b through which byproducts generated from the liquid and air flows are discharged. The byproducts and air flows discharged from the first outlet 323b, the second outlet 325b, and the third outlet 327b are exhausted to an outside of the liquid treating chamber 300 through an exhaust unit 370 to be described later.

The recollecting lines 323c, 325c, and 327c extending vertically in the downward direction are connected to bottom surfaces of each of the recollecting containers 323, 325, and 327. Each of the recollecting lines 323c, 325c, and 327c discharges a liquid introduced through each of the recollecting containers 323, 325, and 327. A discharged treating liquid may be reused through an outer liquid regeneration system (not shown).

The support member 330 supports and rotates the substrate W in the treating space. The support member 330 may have a spin chuck 331, a support pin 333, a chuck pin 335, a rotation shaft 337, and a driver 339.

The spin chuck 331 has a top surface provided in a substantially circular shape when viewed from above. A top surface of the spin chuck 331 may have a diameter greater than that of the substrate W.

A plurality of support pins 333 are provided. The support pin 333 is disposed on the top surface of the spin chuck 331. The support pin 333 is disposed to be spaced apart from a top surface edge region of the spin chuck 331 at a predetermined interval. The support pin 333 is formed to upwardly protrude from the top surface of the spin chuck 331. The support pins 333 are disposed to have an annular ring shape as a whole by a combination thereof. The support pin 333 supports a bottom surface edge region of the substrate W so that the substrate W is spaced apart from the top surface of the spin chuck 331 by a predetermined distance.

A plurality of chuck pins 335 are provided. The chuck pin 335 is disposed relatively far from a central region of the spin chuck 331 than the support pin 333. The chuck pin 335 upwardly protrudes from the top surface of the spin chuck 331. The chuck pin 335 supports a side region of the substrate W so as not to deviate from a regular position in a lateral direction when the substrate W is rotated.

The rotation shaft 337 is coupled to the spin chuck 331. The rotation shaft 337 is coupled to the bottom surface of the spin chuck 331. The rotation shaft 337 may be provided such that a lengthwise direction faces the third direction 6. The rotation shaft 337 is provided to be rotatable by receiving a power from the driver 339. The rotation shaft 337 is rotated by the driver 339, and the spin chuck 331 is rotated through the rotation shaft 337. The driver 339 rotates the rotation shaft 337. The driver 339 may vary a rotation speed of the rotation shaft 337. The driver 339 may be a motor that provides a driving force. However, the inventive concept is not limited thereto, and may be variously modified and provided as a known device providing the driving force.

The liquid supply unit 340 supplies the liquid to the substrate W. The liquid supply unit 340 supplies the liquid to the substrate W supported by the support member 330. The liquid supplied by the liquid supply unit 340 to the substrate W may be provided in a plurality of types. The liquid supply unit 340 may include a support rod 341, an arm 342, a driver 343, a first liquid supply nozzle 344, and a second liquid supply nozzle 345.

The support rod 341 is positioned in the inner space of the chamber 310. The support rod 341 may be positioned on a side of the treating container 320 in the inner space. The support rod 341 may have a rod shape in which lengthwise direction thereof faces the third direction 6. The support rod 341 is provided to be rotatable by a driver 343 to be described later.

The arm 342 is coupled to a top end of the support rod 341. The arm 342 extends vertically from a lengthwise direction of the support rod 341. A lengthwise direction of the arm 342 may be formed in the third direction 6. A first liquid supply nozzle 344, a second liquid supply nozzle 345, and a third liquid supply nozzle 346, which will be described later, may be fixedly coupled to an end of the arm 342.

The arm 342 may be provided to be forwardly and backwardly movable along its lengthwise direction. The arm 342 may be swing-moved by a driver 343 rotating the support rod 341 through the support rod 341. By a rotation of the arm 342, the first liquid supply nozzle 344, the second liquid supply nozzle 345, and the third liquid supply nozzle 346 may also swing and move between a process position and a standby position.

The process position may be a position at which any one of the first liquid supply nozzle 344, the second liquid supply nozzle 345, and the third liquid supply nozzle 346 faces the substrate W supported by the support member 330. According to an embodiment, the process position may be a position at which a center of one of the first liquid supply nozzle 344, the second liquid supply nozzle 345, and the third liquid supply nozzle 346 and a center of the substrate W supported by the support member 330 face each other. The standby position may be a position at which the first liquid supply nozzle 344, the second liquid supply nozzle 345, and the third liquid supply nozzle 346 are all out of the process position.

The driver 343 is coupled to the support rod 341. The driver 343 may be disposed on a bottom surface of the chamber 310. The driver 343 provides a driving force for rotating the support rod 341. The driver 343 may be provided as a known motor providing the driving force.

The first liquid supply nozzle 344 supplies a first liquid on the substrate W. The first liquid supply nozzle 344 may supply the first liquid onto the substrate W supported by the support member 330. The second liquid supply nozzle 345 supplies a second liquid on the substrate W. The second liquid supply nozzle 345 supplies the second liquid onto the substrate W supported by the support member 330. The third liquid supply nozzle 346 supplies a third liquid on the substrate W. The third liquid supply nozzle 346 supplies the third liquid onto the substrate W supported by the support member 330.

According to an embodiment, the first liquid, the second liquid, and the third liquid may be any one of a chemical, a rinsing liquid, and an organic solvent. The chemical may include a diluted sulfuric acid ($H_2SO_4$), a phosphoric acid ($P_2O_5$), a hydrofluoric acid (HF), and ammonium hydroxide ($NH_4OH$). For example, the rinsing liquid may include a pure water or a deionized water DIW. For example, the organic solvent may include an alcohol such as an isopropyl alcohol (IPA). According to an embodiment, the first liquid may be a chemical. The second liquid may also be a rinsing liquid. Also, the third liquid may be an organic solvent.

The liquid supply unit 340 according to an embodiment of the inventive concept is described as an example in which the first liquid supply nozzle 344, the second liquid supply nozzle 345, and the third liquid supply nozzle 346 are all coupled to the arm 342, but is not limited thereto. For example, each of the first liquid supply nozzle 344, the second liquid supply nozzle 345, and the third liquid supply nozzle 346 may independently have an arm, a support rod, and a driver, and may independently swing and move forwardly and backwardly between the process position and the standby position.

The lifting/lowering unit 350 is disposed in an inner space of the chamber 310. The lifting/lowering unit 350 adjusts a relative height between the treating container 320 and the support member 330. The lifting/lowering unit 350 may linearly move the treating container 320 in the third direction 6. Accordingly, the heights of the recollecting container 323, 325, 327 for recollecting the liquid change depending on the liquid type supplied to the substrate W, so that the liquids can be separated and recollected. Unlike the above description, the treating container 320 is fixedly installed, and the lifting/lowering unit 350 may change the relative height between the support member 330 and the treating container 320 by moving the support member 330 in the vertical direction.

The exhaust unit 370 exhausts the byproducts generated in the treating space. The byproducts generated when the substrate W is liquid treated are exhausted by a depressurizing unit (not shown) provided to the exhaust unit 370. The exhaust unit 370 may be coupled to a bottom surface of the treating container 320. In an embodiment, the exhaust unit 370 may be disposed in a space between the rotation shaft 337 and an inner wall of the treating container 320.

The drying chamber 400 may be a process chamber sealed from an outer environment. The drying chamber 400 removes the liquid remaining on the substrate W using a process fluid. According to an embodiment, the drying chamber 400 removes a third liquid (e.g., an organic solvent) remaining on the substrate W using a supercritical fluid. In the drying chamber 400, a supercritical process is performed using characteristics of the supercritical fluid. A representative example may be a supercritical drying process and a supercritical etching process. Hereinafter, a supercritical process will be described based on the supercritical drying process. However, since this is only for convenience of understanding, the drying chamber 400 may perform a supercritical process other than the supercritical drying process. According to an embodiment, a supercritical carbon dioxide ($scCO_2$) may be used as the supercritical fluid.

Figure 3:
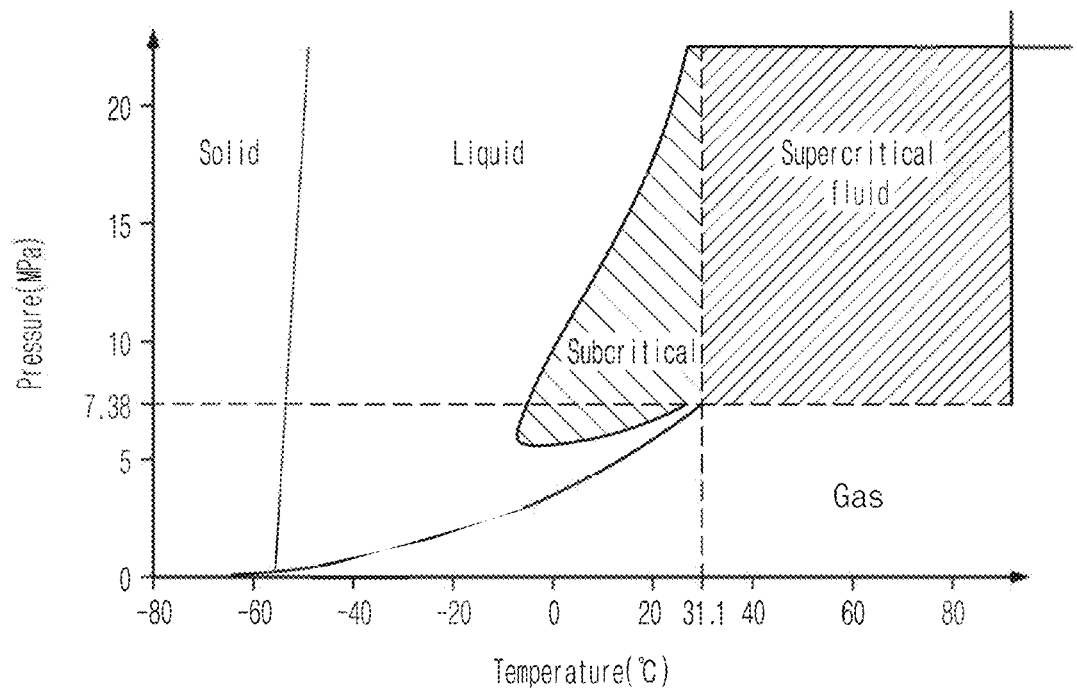
FIG. 3 illustrates a phase change graph of a carbon dioxide.

FIG. 3 illustrates a graph of a phase change of a carbon dioxide. Referring to FIG. 3, a carbon dioxide has advantages in that a critical temperature is 31.1° C., a critical pressure is relatively low at 7.38 MPa, which is therefore is easy to make to a supercritical state, easy to control the phase change by adjusting a temperature and a pressure, and is inexpensive. In addition, the carbon dioxide is not toxic, so it is harmless to the human body, and has the characteristics of non-flammability and inactivity. A supercritical carbon dioxide has a diffusion coefficient which is approximately 10 to 100 times higher than that of water or other organic solvents, resulting in a faster penetration and a faster replacement of the organic solvent. In addition, the supercritical carbon dioxide has little surface tension, so it has advantageous properties for drying the substrate W having a fine circuit pattern. In addition, the supercritical carbon dioxide can be recycled as a by-product of various chemical reactions, and it can be converted into a gas after being used in the supercritical drying process to separate and reuse organic solvents, which is less burdensome in terms of environmental pollution.

Figure 4:
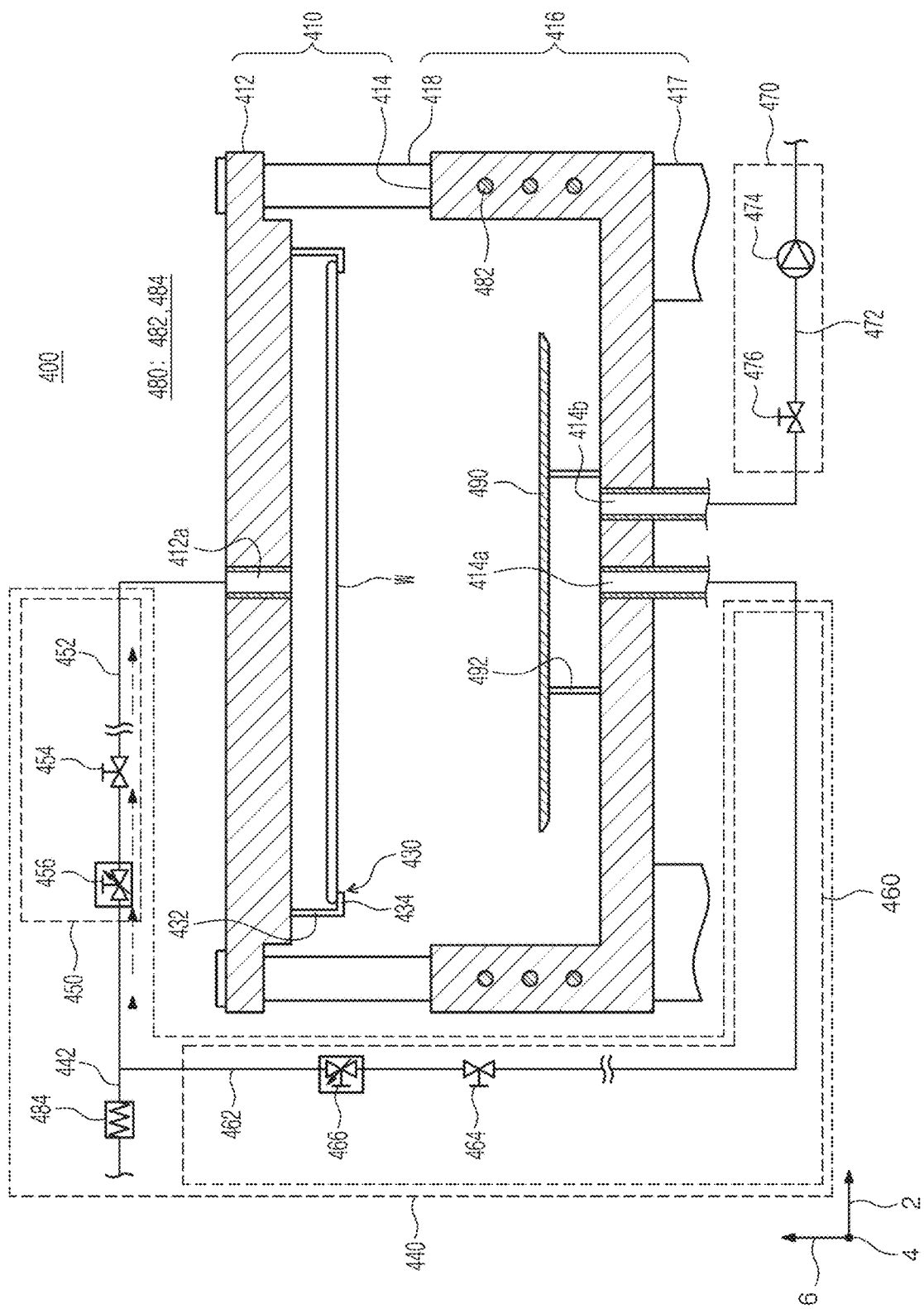
FIG. 4 schematically illustrates an embodiment of a drying chamber of FIG. 1.

FIG. 4 schematically illustrates an embodiment of the drying chamber of FIG. 1. Referring to FIG. 4, the drying chamber 400 may include a housing 410, a support unit 430, a fluid supply unit 440, a fluid discharge unit 470, a heating unit 480, and a blocking plate 490.

The housing 410 has a treating space 401 therein. In the treating space 401, a drying treatment may be performed on the substrate W. The housing 410 may include a first body 412, a second body 414, and a lifting/lowering member 416.

The first body 412 and the second body 414 are combined with each other to define the treating space 401. According to an embodiment, the first body 412 may be positioned above the second body 414. The supply ports 412a and 414a may be formed at the first body 412 and the second body 414, respectively.

According to an embodiment, the first supply port 412a formed at the first body 412 may be formed in a central region of the first body 412 when viewed from above. In addition, the second supply port 414a formed at the second body 414 may be formed in a central region of the second body 414 when viewed from above. In addition, a discharge port 414b may be formed at the second body 414. The discharge port 414b may be formed at a position eccentric by a predetermined distance from the central axis of the second body 414 when viewed from above. For example, the discharge port 414b may be formed at a position spaced apart from a position at which the supply port 414a is formed by a predetermined distance.

The lifting/lowering member 416 lifts and lowers the second body 414. The lifting/lowering member 416 may include a lifting/lowering cylinder 417 and a lifting/lowering rod 418. The lifting/lowering cylinder 417 may be coupled to the second body 414. According to an embodiment, since the lifting/lowering cylinder 417 is coupled to the second body 414, the second body 414 may be lifted and lowered. Alternatively, a position of the first body 412 may be fixed.

The lifting/lowering cylinder 417 may move the second body 414 to closely contact the first body 412 and the second body 414. The lifting/lowering cylinder 417 can overcome a high pressure above a critical pressure of the treating space 401 while drying the substrate W and seal the treating space 401 from the outer environment by closely contacting the first body 412 and the second body 414.

The lifting/lowering cylinder 417 may move the second body 414 to separate the first body 412 from the second body 414. When the first body 412 and the second body 414 are spaced apart from each other, the treating space 401 is opened. When the treating space 401 is opened, the substrate W may be taken into the treating space 401 or the substrate W may be taken out from the treating space 401. The substrate W taken into the treating space 401 may be a substrate W which has been liquid-treated at the liquid-treating chamber 300. For example, the substrate W taken into the treating space 401 may be the substrate W having an organic solvent remaining on its top surface.

The lifting/lowering rod 418 generates a lifting/lowering force. For example, the lifting/lowering rod 418 may generate a force moving in the third direction 6. The lifting/lowering rod 418 may be formed in a direction in which a lengthwise direction thereof faces the third direction 6. An end of the lifting/lowering rod 418 may be inserted into the lifting/lowering cylinder 417. The other end of the lifting/lowering rod 418 may be coupled to the first body 412. The second body 414 may move in the third direction 6 by a relative lifting/lowering motion of the lifting/lowering cylinder 417 and the lifting/lowering rod 418. While the second body 414 is moved in the vertical direction (e.g., the third direction 6), the lifting/lowering rod 418 prevents the first body 412 and the second body 414 from moving in the horizontal direction (e.g., the first direction 2 and the second direction 4). The lifting/lowering rod 418 guides the vertical movement direction of the second body 414. The lifting/lowering rod 418 may prevent the first body 412 and the second body 414 from being separated from their correct positions.

According to an embodiment of the inventive concept described above, it has been described that the second body 414 moves in the vertical direction to seal the treating space 401, but the inventive concept is not limited thereto. For example, the first body 412 and the second body 414 may be moved in a vertical direction, respectively. In addition, the first body 412 may move in the vertical direction, and a position of the second body 414 may be fixed.

Unlike the above-described example, the housing 410 may be provided as a single housing 410 in which an opening (not shown) through which the substrate W is taken in and out is formed at a side of the housing 410. A door (not shown) may be provided in the housing 410. The door (not shown) may move in the vertical direction to open and close the opening (not shown), and the housing 410 may be maintained in a sealed state.

The support unit 430 supports the substrate W in the treating space 401. The support unit 430 may be fixedly installed on a bottom surface of the first body 412. The support unit 430 may have a fixing rod 432 and a holder 434.

The fixing rod 432 is fixedly installed on the first body 412. The fixing rod 432 may be formed to downwardly protrude from a bottom surface of the first body 412. The fixing rod 432 may have a rod shape. The fixing rod 432 is provided such that a lengthwise direction thereof faces the vertical direction. A plurality of fixing rods 432 may be provided. The plurality of fixing rods 432 are disposed to be spaced apart from each other. If the substrate W is taken in or out of a space surrounded by the plurality of fixing rods 432, the plurality of fixing rods 432 are placed in positions which do not interfere with the substrate W. The holder 434 is coupled to each of the fixing rods 432.

The holder 434 extends from the fixing rod 432. The holder 434 may be coupled to a bottom end of the fixing rod 432 and may extend in a direction toward a space surrounded by the fixing rods 432. The holder 434 supports an edge region of the bottom surface of the substrate W. Due to the above-described structure, an entire top surface region of the substrate W, a center region of the bottom surface of the substrate W, and a portion of the edge region of the bottom surface of the substrate W may be exposed to a process fluid supplied to the treating space 401. According to an embodiment, the bottom surface of the substrate W may be a surface on which a pattern is not formed, and the top surface of the substrate W may be a surface on which a pattern is formed.

The fluid supply unit 440 supplies the process fluid to the treating space 401 in the first process step S10 and the second process step S30 to be described later. In addition, the fluid supply unit 440 supplies a treating fluid to the treating space 401 in an optimization step S40 to be described later. According to an embodiment, the process fluid may be a supercritical carbon dioxide (scCO$_2$). In addition, the treating fluid may be a supercritical carbon dioxide (scCO$_2$). Hereinafter, for convenience of explanation, the fluid supply unit 440 will be described as an example of supplying the supercritical fluid including a supercritical carbon dioxide (scCO$_2$) to the treating space 401.

The fluid supply unit 440 may include a main supply pipe 442, a first fluid supply unit 450, and a second fluid supply unit 460.

The main supply pipe 442 may supply the supercritical fluid to the first fluid supply unit 450 and the second fluid supply unit 460. An end of the main supply pipe 442 is connected to a storage source (not shown) in which the supercritical fluid is stored. According to an embodiment, the storage source (not shown) may be a reservoir. The other end of the main supply pipe 442 may be branched into a first supply pipe 452 and a second supply pipe 462 to be described later. A first heater 482 to be described later may be installed in the main supply pipe 442.

The first fluid supply unit 450 supplies the supercritical fluid to the treating space 401. The first fluid supply unit 450 supplies the supercritical fluid to the treating space 401 through the first supply port 412a formed in the first body 412. According to an embodiment, the first fluid supply unit 450 may supply the supercritical fluid to a top region of the treating space 401. The first fluid supply unit 450 may supply the supercritical fluid in a direction toward a top surface of the substrate W supported by the support unit 430.

The first fluid supply unit 450 may include a first supply pipe 452 and a first valve 454. An end of the first supply pipe 452 branches from the main supply pipe 442. The other end of the first supply pipe 452 is connected to the first supply port 412a. The first supply pipe 452 receives the supercritical fluid from the main supply pipe 442, and supplies it to the treating space 401 through the first supply port 412a.

The first valve 454 is installed in the first supply pipe 452. The first valve 454 may be provided as an opening/closing valve capable of selectively opening/closing the first supply pipe 452. If the first valve 454 is opened, the supercritical fluid stored in the storage source (not shown) may be supplied to the treating space 401 through the main supply pipe 442, the first supply pipe 452, and the first supply port 412a.

In addition, a first flow rate control valve 456 capable of adjusting a flow rate of the supercritical fluid may be installed in the first supply pipe 452. The first flow rate control valve 456 may be provided upstream of the first supply pipe 452 than the first valve 454. As the first flow rate control valve 456 adjusts the flow rate inside the first supply pipe 452, a flow rate per unit time of the supercritical fluid supplied to the treating space 401 may be changed. The flow rate per unit time of the supercritical fluid supplied to the treating space 401 is changed, so that a pressure caused by the supercritical fluid inside the first supply pipe 452 and the treating space 401 may be changed.

The second fluid supply unit 460 supplies the supercritical fluid to the treating space 401. The second fluid supply unit 460 supplies the supercritical fluid to the treating space 401 through a second supply port 414a formed in the second body 414. According to an embodiment, the second fluid supply unit 460 may supply the supercritical fluid to a bottom region of the treating space 401. The second fluid supply unit 460 may supply the supercritical fluid in a direction toward the bottom surface of the substrate W supported by the support unit 430.

The second fluid supply unit 460 may include a second supply pipe 462 and a second valve 464. An end of the second supply pipe 462 branches from the main supply pipe 442. The other end of the second supply pipe 462 is connected to the second supply port 414a. The second supply pipe 462 receives the supercritical fluid from the main supply pipe 442, and supplies it to the treating space 401 through the second supply port 414a.

The second valve 464 is installed in the second supply pipe 462. The second valve 464 may be provided as an opening/closing valve for selectively opening/closing the second supply pipe 462. If the second valve 464 is opened, the supercritical fluid stored in the storage source (not shown) may be supplied to the treating space 401 through the main supply pipe 442, the second supply pipe 462, and the second supply port 414a.

In addition, a second flow rate control valve 466 capable of adjusting a flow rate of the supercritical fluid may be installed in the second supply pipe 462. The second flow rate control valve 466 may be provided upstream of the second supply pipe 462 than the second valve 464. As the second flow rate control valve 466 adjusts an opening flow rate, a flow rate per unit time of the supercritical fluid supplied to the treating space 401 may be changed. The flow rate per unit time of the supercritical fluid supplied to the treating space 401 is changed, so that a pressure caused by the supercritical fluid inside the second supply pipe 462 and the treating space 401 may be changed.

The first flow rate control valve 456 and the second flow rate control valve 466 described above may be provided as a metering valve. Selectively, the first flow control valve 456 and the second flow control valve 466 may be provided as a pendulum valve or a buffer fly valve. However, types of the first flow rate control valve 456 and the second flow rate control valve 466 are not limited thereto, and may be variously modified and provided as a known flow rate control valve capable of controlling a flow rate of the fluid.

In addition, in the above example, the first valve 454 is installed upstream of the first supply pipe 452 than the first flow control valve 456, but the inventive concept is not limited thereto. For example, the first valve 454 may be installed downstream of the first supply pipe 452 than the first flow rate control valve 456. In addition, the second valve 464 may be installed downstream of the second supply pipe 462 than the second flow control valve 466.

The fluid discharge unit 470 exhausts an atmosphere of the treating space 401. In addition, the fluid discharge unit 470 discharges the supercritical fluid supplied to the treating space 401. The fluid discharge unit 470 may include a discharge pipe 472, a depressurizing member 474, and a discharge valve 476.

An end of the discharge pipe 472 is connected to the discharge port 414b formed in the second body 414. The other end of the discharge pipe 472 is connected to the depressurizing member 474. The depressurizing member 474 may be provided as a motor providing a negative pressure. The supercritical fluid supplied to the treating space 401 is discharged to the outside of the housing 410 through the discharge port 414b and the discharge pipe 472.

In addition, a discharge valve 476 is installed in the discharge pipe 472. The discharge valve 476 may be provided as an opening/closing valve.

The heating unit 480 changes a temperature of the supercritical fluid. According to an embodiment, the heating unit 480 may be provided as a heater. The heating unit 480 may include a first heater 482 and a second heater 484.

According to an embodiment, the first heater 482 may be installed on a sidewall of the housing 410. For example, the first heater 482 may be embedded in at least any one sidewall of the first body 412 and the second body 414. The first heater 482 may change the temperature of the supercritical fluid flowing in the treating space 401 by changing the temperature of the treating space 401. The first heater 482 may heat the supercritical fluid supplied to the treating space 401 at a critical temperature or higher to maintain the supercritical fluid phase. In addition, if the supercritical fluid supplied to the treating space 401 is liquefied, the first heater 482 may heat the supercritical fluid supplied to the treating space 401 so that the supercritical fluid changes into a supercritical phase again.

According to an embodiment, the second heater 484 may be installed in the fluid supply unit 440. For example, the second heater 484 may be installed in the main supply pipe 442. The second heater 484 may change the temperature of the supercritical fluid flowing inside the main supply pipe 442 by changing an inner temperature of the main supply pipe 442. The second heater 484 may heat the supercritical fluid flowing inside the main supply pipe 442 to a critical temperature or higher and maintain the supercritical fluid phase. In addition, the second heater 484 may increase the inner temperature of the main supply pipe 442 so that the supercritical fluid flowing inside the main supply pipe 442 changes to a supercritical phase again when liquefied.

In the above-described example, a case in which the second heater 484 is installed in the main supply pipe 442 has been described as an example, but the inventive concept is not limited thereto. For example, the second heater 484 may be installed in at least one of the main supply pipe 442, the first supply pipe 452, and the second supply pipe 462.

The blocking plate 490 is disposed in the treating space 401. The blocking plate 490 may be disposed on a path of a supercritical fluid supplied from the second supply port 414a. The blocking plate 490 may be installed at a position overlapping the second supply port 414a and the discharge port 414b formed in the second body 414 when viewed from above. The blocking plate 490 may prevent the supercritical fluid supplied from the second supply port 414a from being directly discharged toward the substrate W to damage the bottom surface of the substrate W.

A support 492 is coupled to a bottom end of the blocking plate 490. The support 492 may be provided in a rod shape. A plurality of supports 492 may be provided. The plurality of supports 492 are disposed to be spaced apart from each other by a predetermined distance. The support 492 is coupled to a bottom surface of the housing 410. The support 492 is formed to upwardly protrude from the bottom surface of the housing 410. Accordingly, the blocking plate 490 may be disposed to be spaced apart from the bottom surface of the housing 410 by a predetermined distance.

Hereinafter, a substrate treating method according to an embodiment of the inventive concept will be described in detail. The substrate treating method described below may be performed in the drying chamber 400. In addition, the controller 30 may perform a substrate treating method described below by controlling the components of the drying chamber 400.

Figure 5:
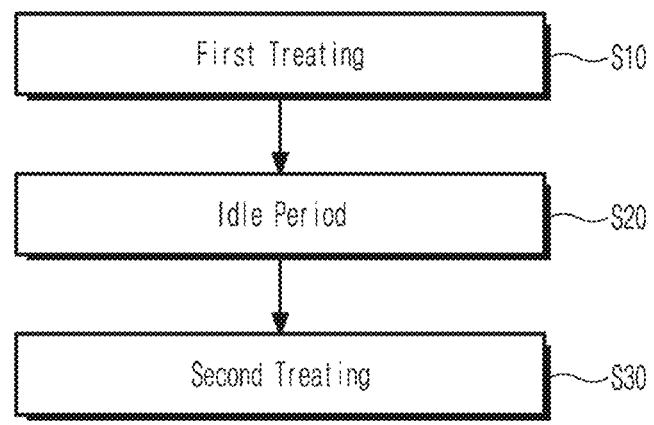
FIG. 5 is a flowchart illustrating a substrate treating method in the drying chamber according to an embodiment of FIG. 4.

FIG. 5 is a flowchart illustrating a substrate treating method in a drying chamber according to an embodiment of FIG. 4. Referring to FIG. 5, the substrate treating method according to an embodiment may include a first process step S10 and a second process step S30. In addition, after the first process step S10 is completed, an idle (IDLE) section S20 may be provided before the second process step S30 is started. The idle period S20 may be a section in which the substrate W is not treated and stands-by in the treating space 401 of the drying chamber 400. For example, in the idle period S20, the substrate W may be maintained in a state in which the substrate W is not taken into the treating space 401.

The first process step S10 may be performed after the liquid treatment is completed on the substrate W in the liquid treating chamber 300. The substrate W taken into the drying chamber 400 in the first process step S10 may be the substrate W that has been liquid-treated in the liquid-treating chamber 300. For example, the substrate W taken into the treating space 401 may be the substrate W in which an organic solvent remains on its top surface.

In the first process step S10, the substrate W may be treated in the drying chamber 400. According to an embodiment, in the first process step S10, a drying process of removing the liquid supplied to the substrate W by supplying the process fluid to the treating space 401 may be performed. For example, the process fluid may be a supercritical fluid. In the first process step S10, the drying process is performed on the substrate W based on a reference recipe. In the first process step S10, the substrate W positioned in the treating space 401 may be dried under temperature and pressure conditions of the reference recipe. For example, the temperature and pressure conditions of the reference recipe may be a critical temperature and a critical pressure at which the supercritical fluid may be maintained in the supercritical state.

In the second process step S30, a drying process of removing the liquid supplied to the substrate W by supplying the process fluid to the treating space 401 may be performed. For example, the process fluid may be a supercritical fluid. The second process step S30 may be performed after the first process step S10 is completed. In addition, the second process step S30 may be performed after the idle period S20.

In the first process step S10, the substrates W stored in any one of the cassettes C placed in the load port 120 described with reference to FIG. 1 may be dried. In addition, in the second process step S30, subsequent substrates W stored in the other cassette C among the cassettes C placed in the load port 120 may be dried.

Most of the first process step S10 and the second process step S30 perform similar processes. For example, in the first process step S10, a process of drying the substrate W by supplying the supercritical fluid to the substrate W is similarly provided in the second process step S30. Accordingly, hereinafter, the first process step S10 will be described in detail, and the description of the second process step S30 in which the contents thereof are overlapped will be omitted.

Figure 6:
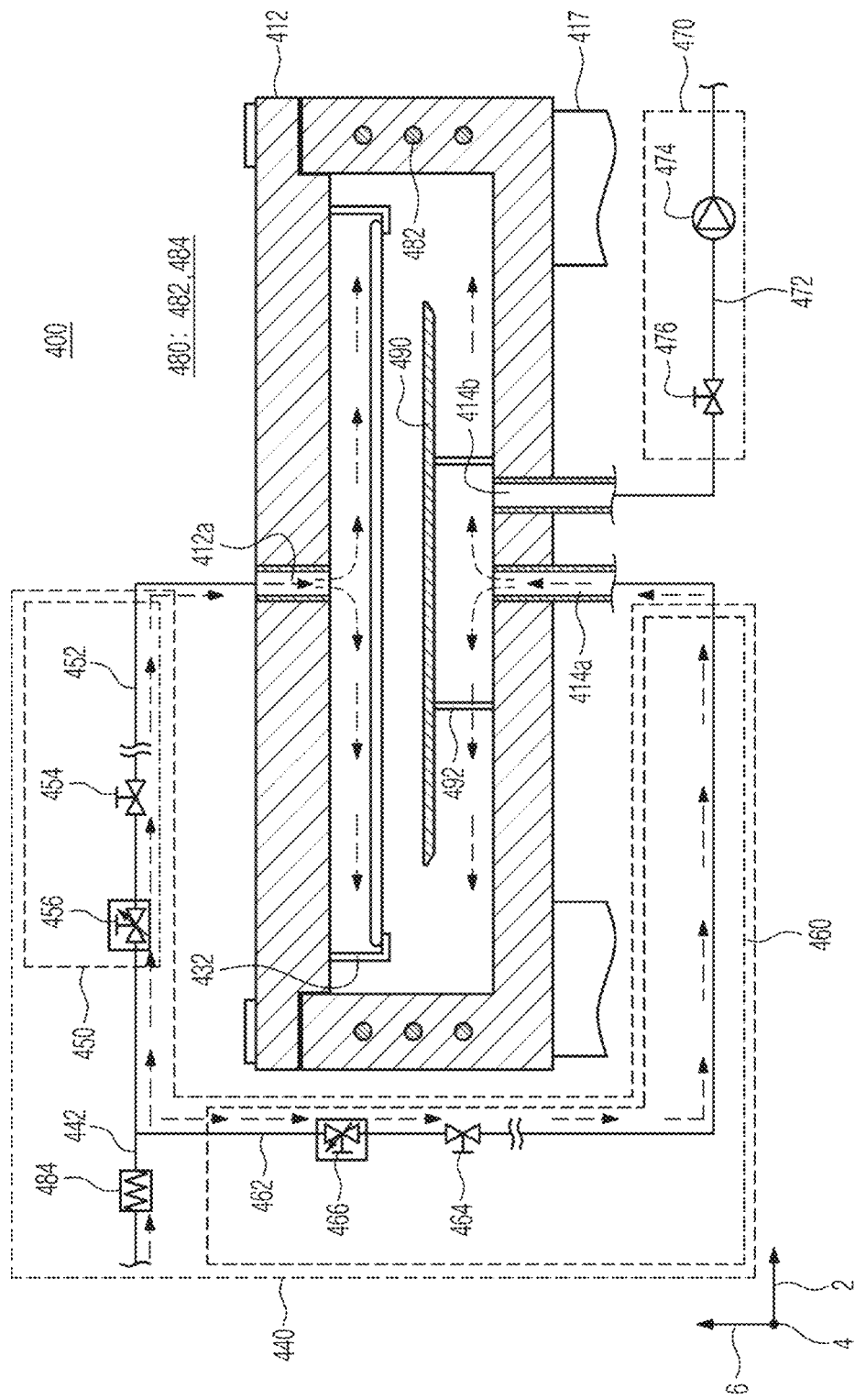
FIG. 6 schematically illustrates a state of the drying chamber performing a first process step according to an embodiment of FIG. 5.

FIG. 6 schematically illustrates a state of a drying chamber performing a first process step according to an embodiment of FIG. 5. Referring to FIG. 6, the first process step S10 is performed in a state in which the treating space 401 is sealed by the first body 412 and second body 414 being brought in close contact at the treating space 401, after bringing in the substrate W to the treating space 401 to mount on the support unit 430. In the first process step S10, after the treating space 401 is sealed, the supercritical fluid is supplied to the treating space 401. The supercritical fluid supplied to the treating space 401 may satisfy the reference recipe.

In the first process step S10, both the first valve 454 and the second valve 464 may be opened to supply the supercritical fluid to the treating space 401. If the first valve 454 is opened, the supercritical fluid is supplied to the top region of the treating space 401 through the main supply pipe 442, the first supply pipe 452, and the first supply port 412*a*. For example, the supercritical fluid may be supplied toward the top surface of the substrate W through the first supply port 412*a*. If the second valve 4644 is opened, the supercritical fluid is supplied to the bottom region of the treating space 401 through the main supply pipe 442, the second supply pipe 462, and the second supply port 414*a*. For example, the supercritical fluid may be supplied toward the bottom surface of the substrate W through the second supply port 414*a*.

While supplying the supercritical fluid to the treating space 401 in the first process step S10, the first heater 482 may heat the treating space 401. For example, the first heater 482 may maintain the inner temperature of the treating space 401 at a critical temperature or higher. In addition, in the first process step S10, the second heater 484 installed in the main supply pipe 442 may change a temperature inside the main supply pipe 442. For example, the second heater 484 may maintain the temperature of the supercritical fluid flowing inside the main supply pipe 442 at the critical temperature or higher. Accordingly, the temperature-controlled supercritical fluid may be supplied to the top region of the treating space 401 through the main supply pipe 442, the first supply pipe 452, and the first supply port 412*a*. In addition, the temperature-controlled supercritical fluid may be supplied to the top region of the treating space 401 through the main supply pipe 442, the second supply pipe 462, and the second supply port 414*a*.

In addition, while supplying the supercritical fluid to the treating space 401 in the first process step S10, the pressure of the supercritical fluid flowing inside the first supply pipe 452 may be kept constant. For example, the first flow rate control valve 456 may change its opening rate to maintain the pressure of the supercritical fluid flowing inside the first supply pipe 452 above the critical pressure. In addition, the second flow control valve 466 can change its opening rate to maintain the pressure of the supercritical fluid flowing inside the second supply pipe 462 above the critical pressure. Accordingly, the pressure of the supercritical fluid may be supplied to the treating space 401 in a state in which the pressure is maintained at the critical pressure.

The supercritical fluid having a critical temperature and a pressure is supplied to the treating space 401, and the supercritical fluid and the liquid (e.g., an organic solvent) remaining on the top surface of the substrate W are mixed with each other to remove the liquid remaining on the top surface of the substrate W. In the process of removing the liquid remaining on the substrate W, byproducts or the like generated are discharged to the outside of the housing 410 through the discharge pipe 472.

Figure 7:
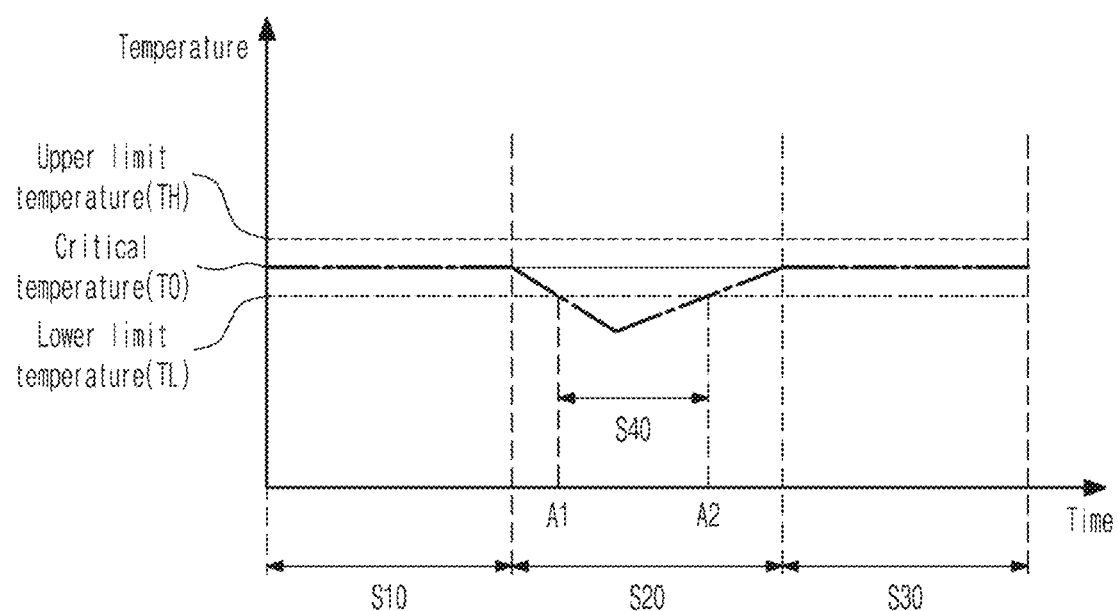
FIG. 7 is a graph schematically illustrating a section in which an optimization step is performed according to an embodiment of the inventive concept.

FIG. 7 is a graph schematically illustrating a section in which an optimization step is performed according to an embodiment of the inventive concept. The horizontal axis of FIG. 7 refers to time, and the vertical axis refers to the temperature of the supercritical fluid inside the pipes 442, 452, and 462.

Hereinafter, an embodiment in which an optimization step is performed in a drying chamber according to an embodiment of the inventive concept described with reference to FIG. 4 will be described in detail. Referring to FIG. 4 and FIG. 7, in the optimization step S40 according to an embodiment of the inventive concept, an inner environment of the treating space 401 shown in FIG. 4 is optimized based on a reference recipe for treating the substrate W in the first process step S10 and the second process step S30. The inner environment may be a concept including a temperature, a pressure, or a degree of contamination due to byproducts in the treating space 401. For example, a temperature condition of the reference recipe may be a critical temperature T0 at which the supercritical fluid may be maintained in a supercritical state. For example, the pressure condition of the reference recipe may be a critical pressure at which the supercritical fluid may be maintained in the supercritical state. In addition, a pollution level condition of the reference recipe may mean a state in which byproducts are removed inside the treating space 401.

The optimization step S40 according to an embodiment may be performed in the idle period S20. For example, the optimization step S40 may be performed if the temperature of the treating space is out of a reference range in the idle period S20. In addition, the optimization step S40 may be performed if the inner temperature of the main supply pipe 442, the first supply pipe 452, and the second supply pipe 462 is outside the reference range during the idle period S20. For example, the optimization step S40 may be performed if any one of the temperature of the treating space 401 and an inner temperature of the pipes 442, 452, and 462 in the idle period S20 is outside the reference range.

The temperature of the treating space 401 and/or the inner temperature of the pipes 442, 452, and 462 may be measured by a temperature measuring sensor which is not shown. For example, the temperature measuring sensor (not shown) may be embedded in an inner wall of the housing 410. For example, the temperature measuring sensor (not shown) may be installed in the pipes 442, 452, and 462, respectively. The reference range of the inner temperature treating space 401 and/or the pipes 442, 452, and 462 may be a value obtained by determining a top limit TH and a bottom limit TL of the critical temperature T0 of the supercritical fluid of the reference recipe. The temperature reference range value may be a value previously stored in the controller 30.

In addition, the optimization step S40 may be performed if the pressure of the treating space 401 is out of the reference range in the idle period S20. In addition, the optimization step S40 may be performed if the inner pressure of the pipes 442, 452, and 462 is outside the reference range in the idle period S20. According to an embodiment, the optimization step S40 may be performed from a time at which any one of the pressure in the treating space 401 and the inner pressure in the pipes 442, 452, and 462 in the idle period S20 is out of the reference range to a point the reference range is satisfied.

Hereinafter, for convenience of understanding, a case in which the optimization step S40 is performed if the inner temperatures of the pipes 442, 452, and 462 are outside the reference range will be described as an example.

As described above, the supercritical fluid is not supplied to the treating space 401 in the idle period S20. That is, in the idle period S20, both the first valve 454 and the second valve 464 are provided in a closed state. Accordingly, in the idle period S20, the supercritical fluid does not flow inside the pipes 442, 452, and 462 and remains. Accordingly, the temperature of the supercritical fluid maintained at the critical temperature T0 in the first process step S10 may decrease as time elapses in the idle period S20, and the temperature of the supercritical fluid remaining inside the pipes 442, 452, and 462 may be out of the reference range (e.g., the bottom limit temperature TL).

An optimization step S40 is performed at a time A1 at which the temperature of the supercritical fluid remaining inside the pipes 442, 452, and 462 is out of the reference range. In the optimization step S40, the second heater 484 increases the inner temperature of the main supply pipe 442. Accordingly, the temperature of the supercritical fluid remaining in the main supply pipe 442 increases. For example, the second heater 484 may increase the inner temperature of the main supply pipe 442 until the temperature of the supercritical fluid remaining inside the main supply pipe 442 satisfies the temperature to the critical temperature T0 or above. That is, the optimization step S40 may be performed up to a time point A2 at which the temperature of the supercritical fluid inside the main supply pipe 442 satisfies the reference range.

Figure 8:
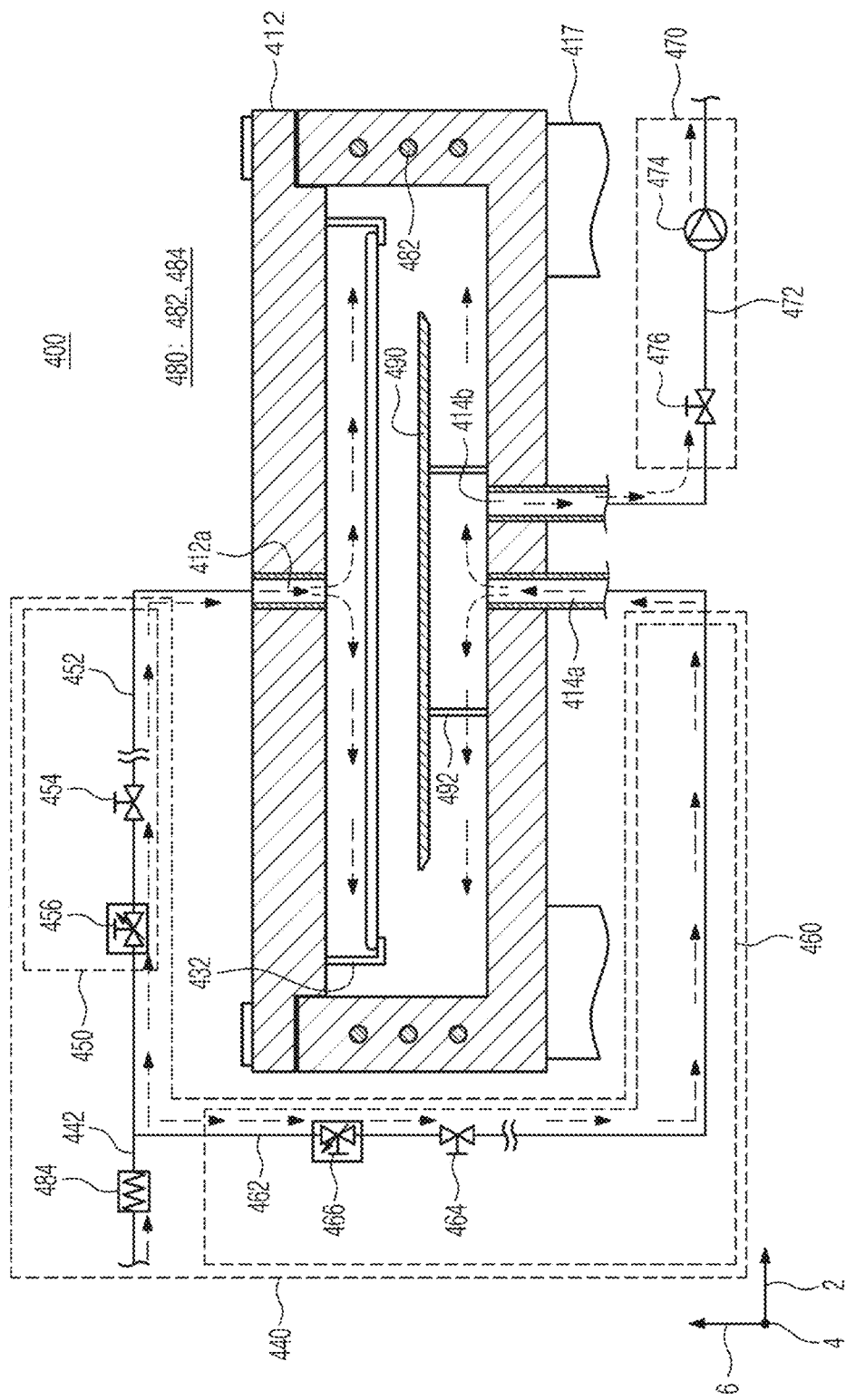
FIG. 8 schematically illustrates a state of the drying chamber performing a purge operation in the optimization step according to an embodiment of FIG. 7.

FIG. 8 schematically illustrates a state of the drying chamber performing a purge operation in the optimization step according to an embodiment of FIG. 7.

Referring to FIG. 8, in the optimization step S40, the first valve 454, the second valve 464, and the discharge valve 476 are opened. In the optimization step S40, the treating fluid may be supplied and discharged into the treating space 401. For example, the treating fluid may be a supercritical fluid. In the optimization step S40, a temperature of the supercritical fluid inside the main supply pipe 442 is increased, and the supercritical fluid remaining inside the pipes 442, 452, and 462 is supplied to the treating space 401. In addition, the supercritical fluid supplied to the treating space 401 is discharged to the outside of the treating space 401 through the discharge pipe 472. In other words, in the optimization step S40, the supercritical fluid inside the pipes 442, 452, 462 is heated, the heated supercritical fluid is supplied to the treating space 401, and the fluid supplied to the treating space 401 is discharged to the outside of the treating space 401. The operation of increasing the temperature of the supercritical fluid, the operation of supplying the heated supercritical fluid, and the operation of discharging the heated supercritical fluid may all be performed simultaneously.

In the process of performing the first process step S10 described with reference to FIG. 6, byproducts generated in the treating space 401 may be attached to the inner wall of the housing 410. In addition, if the support unit 430 supports a rear surface of an edge region of the substrate W to perform the first process step S10, the liquid remaining in the rear surface of the edge region of the substrate W may be attached to the support unit 430. In the process of performing the first process step S10, byproducts remaining in the treating space 401 act as a source of contamination to a subsequent substrate W treated in the second process step S30.

The purge operation according to an embodiment of the inventive concept described above repeats the purge operation of supplying and discharging the supercritical fluid into the treating space 401. The byproduct remaining inside the treating space 401 by the purge operation may be removed by a supply operation of supplying the supercritical fluid into the treating space 401. The byproducts removed from the treating space 401 are discharged to the outside of the treating space 401 together with the supplied supercritical fluid. Accordingly, byproducts generated in the first process step S10 and remaining in the treating space 401 may be removed from the idle period S20 before the second process step S30 is performed, thereby minimizing a contamination of the subsequent substrate W treated in the second process step S30.

If the second process step S30 is performed after the idle period S20, the initial substrate W treated in the second process step S30 may be damaged due to a change in the inner environment of the treating space 401. Specifically, since the supercritical fluid is not supplied to the treating space 401 in the idle period S20 as aforementioned, the initial inner environment (e.g., temperature or pressure) of the treating space 401 in the second process step S30 may be different from that of the first process step S10. For example, the initial section of the second process step S30 may be in a state in which a degree of inner contamination of the treating space 401 is relatively increased than that of the first process step S10. In addition, the initial section of the second process step S30 may be in a state in which the inner temperature of the treating space 401 is relatively lower than that of the first process step S10. In addition, the initial section of the second process step S30 may be in a state in which the inner pressure is relatively lower than that of the first process step S10.

Accordingly, in the initial section of the second process step S30, the temperature and the pressure of the treating space 401 may proceed below the critical temperature and the critical pressure of the supercritical fluid. Due to a changed temperature and pressure of the treating space 401, the supercritical fluid supplied to the treating space 401 may be liquefied. Moreover, the supercritical fluid that remains inside the pipes 442, 452, and 462 while the temperature and the pressure is lowered in the idle period S20 may liquefy inside the pipes 442, 452, and 462. The liquefied supercritical fluid falls on the substrate W positioned in the treating space 401 by a gravitational force, damaging the pattern formed on the top surface of the substrate W. In addition, it takes a considerable amount of time for the supercritical fluid supplied to the treating space 401 to satisfy a reference recipe having a critical temperature and a critical pressure.

In addition, in the optimization step S40 according to an embodiment of the inventive concept, the inner environment of the treating space 401 may be optimized in the idle period S20 before performing the second process step S30. In the optimization step S40, the supercritical fluid in which the temperature and the pressure are adjusted to satisfy a reference range is supplied to the treating space 401. That is, in the optimization step S40, the supercritical fluid having a temperature equal to or similar to that of the reference recipe in the first step S10 and/or the second step S30 may be supplied to the treating space 401. In addition, in the optimization step S40, a supercritical fluid having a pressure equal to or similar to that of the reference recipe in the first step S10 and/or the second step S30 may be supplied to the treating space 401. Accordingly, even in the initial section of the second process step S30, the supercritical fluid having the reference recipe may be supplied to the treating space 401.

In addition, by maintaining the inner environment of the treating space 401 to be constant in the first process step S10, the idle period S20, and the second process step S30, it is possible to suppress a flow hunting phenomenon caused by the supercritical fluid that may occur in the initial section when each step is changed. In addition, as described above, not only the temperature or the pressure of the treating space 401, but also the byproducts remaining in the treating space 401 due to the purge operation can be removed to improve a contamination rate of the treating space 401.

In the above-described embodiment, the second heater 484 is heated according to a supercritical fluid temperature in the main supply pipe 442 to perform the optimization step S40, but the inventive concept is not limited thereto. As mentioned above, since the second heater 484 can be installed in at least one of the main supply pipe 442, the first supply pipe 452, and the second supply pipe 462, the optimization step S40 can heat the second heater 484 installed at each respective pipe to independently increase the temperature of the supercritical fluid, and perform a purge operation, if the temperature of the an inner supercritical liquid among the main supply pipe 442, the first supply pipe 452, and the second supply pipe 462 are outside a reference range.

In addition, if the pressure in the treating space 401 is outside the reference range, the first valve 454, the second valve 464, and the discharge valve 476 shown in FIG. 4 are opened, and an opening rate of the first flow control valve 456 and the second flow control valve 466 is increased to increase a unit flow rate of the supercritical fluid supplied to the treating space 401. The optimization step S40 may be performed until the inner pressure of the treating space 401 and/or the pipes 442, 452, 462 satisfies the reference range by increasing a flow rate of the supercritical fluid.

Figure 9:
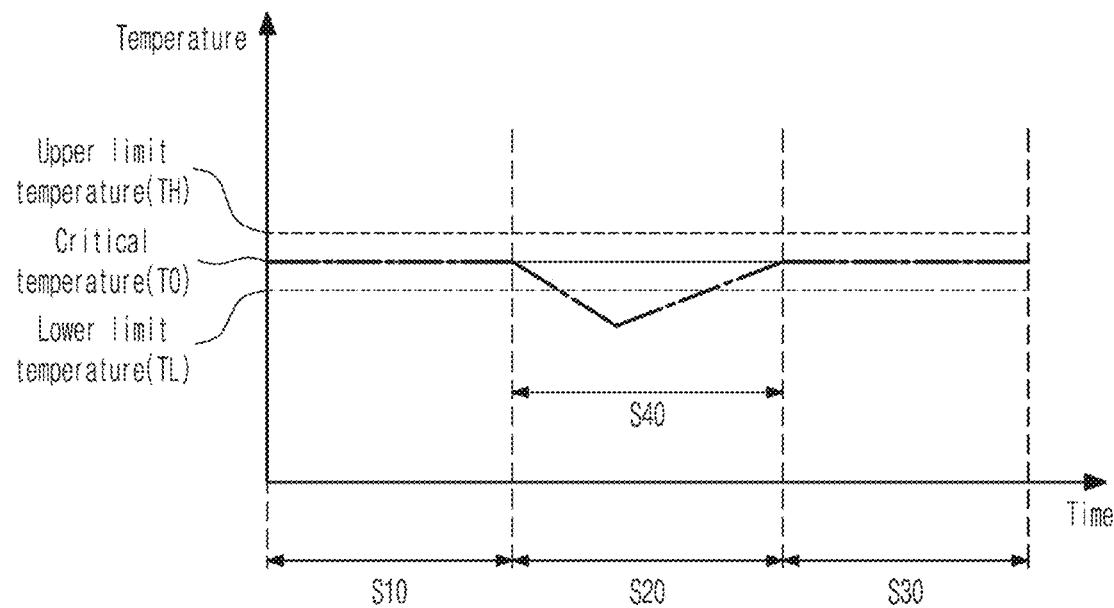
FIG. 9 to FIG. 11 schematically illustrate a section in which the optimization step is performed according to another embodiment of FIG. 7.
Figure 10:
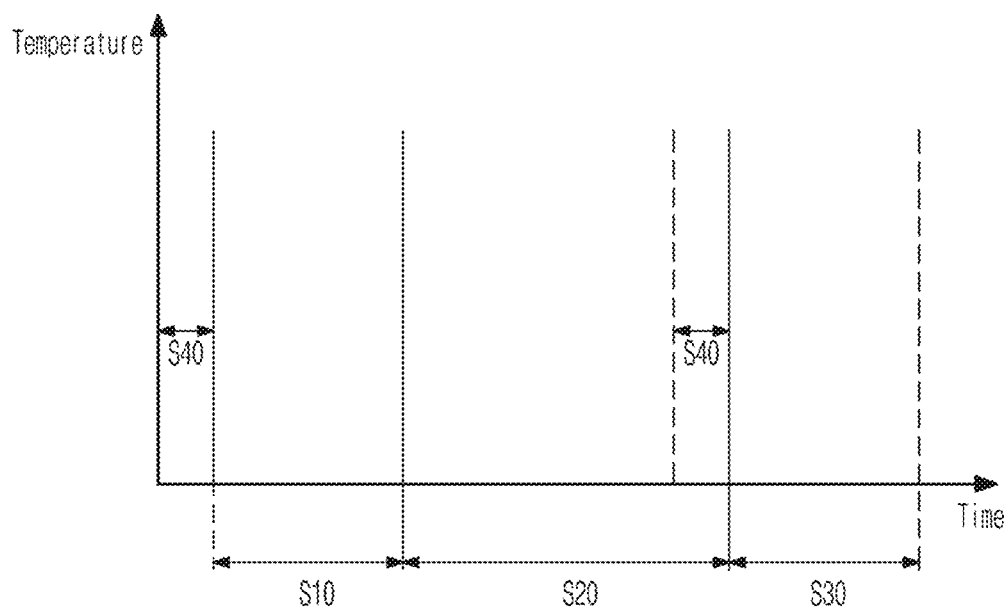
Figure 11:
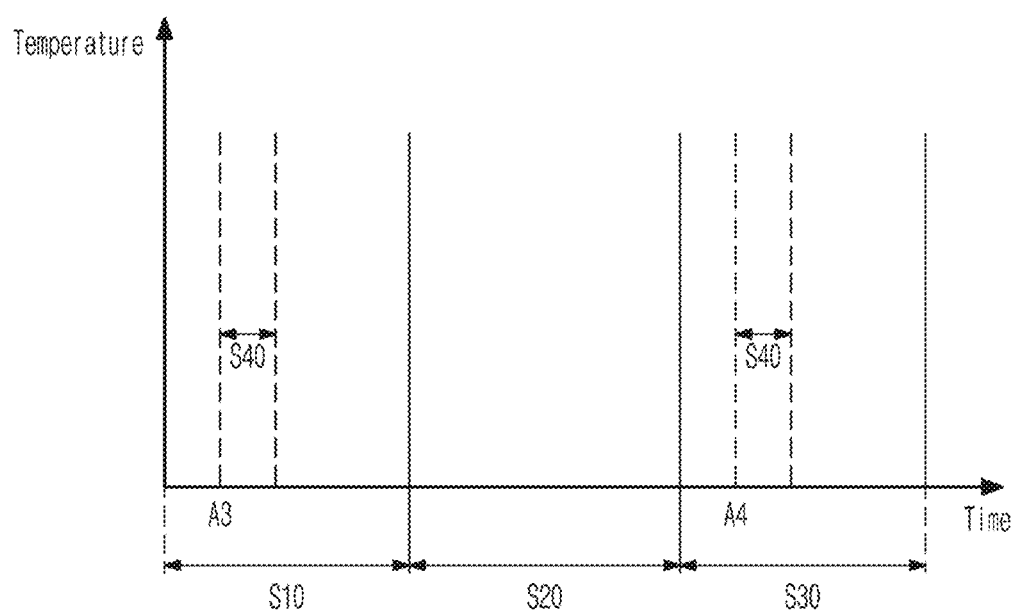

FIG. 9 to FIG. 11 schematically illustrating a section in which an optimization step is performed according to another embodiment of FIG. 7.

Referring to FIG. 9, the optimization step S40 may be performed from a time point at which the inner temperature of the main supply pipe 442 shown in FIG. 4 deviates from the critical temperature T0 to a time point when the temperature is increased to the critical temperature T0. Accordingly, the purge operation may be performed from a time at which the inner temperature of the main supply pipe 442 shown in FIG. 4 deviates from the critical temperature T0 to a time at which the critical temperature T0 is satisfied. As shown above, in the optimization step S40 according to the embodiment of FIG. 9, if the temperature of the inner supercritical fluid of the main supply pipe 442, the first supply pipe 452, and the second supply pipe 462 deviate from the reference range, the second heater 484 installed at the pipe can be heated independently to increase the temperature of the supercritical fluid, and the purge operation may be performed.

Referring to FIG. 10, the optimization step S40 may be performed before the drying chamber 400 shown in FIG. 4 performs a process of treating the substrate W by supplying the supercritical fluid. For example, the optimization step S40 may be performed before the first process step S10. Specifically, the optimization step S40 may be performed before a preceding substrate W stored in any one cassette C (see FIG. 1) is taken into the treating space 401 shown in FIG. 4 in the first process step S10. In addition, the optimization step S40 may be performed before the second process step S30. Specifically, the optimization step S40 may be performed before the preceding substrate W stored in the other cassette C (see FIG. 1) is taken into the treating space 401 shown in FIG. 4 in the second process step S30. In the optimization step S40, the above-described purge operation may be performed.

According to the above-described embodiment, before the substrate W is treated in the drying chamber 400 shown in FIG. 4, the inner environment of the treating space 401 may be preemptively created as an environment suitable for treating the substrate W with the supercritical fluid.

Referring to FIG. 11, the optimization step S40 may be performed during a process of treating the substrate W by supplying the supercritical fluid from the drying chamber 400 shown in FIG. 4. For example, the optimization step S40 may be performed in the first process step S10 and/or the second process step S30. More specifically, the optimization step S40 may be performed from a time point after the preceding substrate W stored in any one cassette C (see FIG. 1) is treated in the first process step S10. For example, in the optimization step S40, after treating one substrate W stored in any one cassette C (see FIG. 1) in the first process step S10, it may be performed from a time point A3 at which the substrate W is taken out from the treating space 401 shown in FIG. 4.

In addition, the optimization step S40 may be performed after the preceding substrate W stored in the other cassette (C, see FIG. 1) is treated in the second process step S30. For example, in the optimization step S40, after treating one substrate W stored in the other cassette (C, see FIG. 1) in the second process step S30, it may be performed from a time point A4 at which the substrate W is taken out from the treating space 401 shown in FIG. 4.

Unlike the above-described method, the idle period S20 may not be provided in the substrate treating method according to an embodiment described in FIG. 10 and FIG. 11. For example, the substrate treating method may include a first process step S10 and a second process step S30, and the optimization step S40 may be performed before each process step S10 and S30 is performed. In addition, the substrate treating method includes a first process step S10 and a second process step S30, and the optimization step S40 may be performed after the first substrate W is treated in each process step S10 and S30.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating method comprising:
    first treating a substrate in a treating space according to a reference recipe;
    second treating a substrate in the treating space according to the reference recipe after the first treating; and
    optimizing an inner ambient of the treating space according to the reference recipe, and
    wherein the optimizing includes a purge operation of supplying and discharging a treating fluid to/from the treating space,
        wherein the first treating and the second treating comprise removing a liquid on the substrate by supplying a supercritical fluid to the treating space,
        wherein the optimizing is performed with the substrate removed from the treating space, and
        wherein an inner ambient of the treating space when performing the first eating is the same as an inner ambient of the treating space when performing the second treating.

2. The substrate treating method of claim 1, wherein an idle period is provided between the first treating and the second treating, and
    the optimizing is performed during the idle period.

3. The substrate treating method of claim 2, wherein the purge operation is performed if any one of a temperature of the treating space and a temperature of a pipe supplying the treating fluid deviates from a reference range during the idle period.

4. The substrate treating method of claim 3, wherein the purge operation is performed until the temperature of the treating space and the temperature of the pipe each satisfy the reference range.

5. The substrate treating method of claim 1, wherein the optimizing is performed before a substrate previously stored at a cassette is taken into the treating space according to the reference recipe.

6. The substrate treating method of claim 1, wherein the optimizing is performed after a substrate previously stored at a cassette is treated in the treating space during the first treating.

7. The substrate treating method of claim 1, wherein the treating fluid is supplied to each of an upper portion and a lower portion of the treating space.

8. The substrate treating method of claim 7, wherein the treating fluid is a supercritical fluid.

9. The substrate treating method of claim 1, wherein the inner ambient includes a temperature, a pressure, and/or a contamination rate.

* * * * *

UNITED STATES PATENT AND TRADEMARK OFFICE
CERTIFICATE OF CORRECTION

PATENT NO. : 12,208,425 B2  
APPLICATION NO. : 18/068940  
DATED : January 28, 2025  
INVENTOR(S) : Ki-Moon Kang et al.

Page 1 of 1

It is certified that error appears in the above-identified patent and that said Letters Patent is hereby corrected as shown below:

On the Title Page

Item (54) and in the Specification Column 1 Line 1 "APPARATUS FOR TREATING SUBSTRATE AND METHOD FOR TREATING A SUBSTRATE PRELIMINARY CLASS" should be "APPARATUS FOR TREATING SUBSTRATE AND METHOD FOR TREATING A SUBSTRATE"

Signed and Sealed this  
Eighteenth Day of March, 2025

Coke Morgan Stewart  
*Acting Director of the United States Patent and Trademark Office*